United States Patent
Bond et al.

(10) Patent No.: US 8,836,478 B2
(45) Date of Patent: Sep. 16, 2014

(54) ELECTRONIC DEVICE INCLUDING FINGER SENSOR AND RELATED METHODS

(75) Inventors: Robert H. Bond, Plano, TX (US); Giovanni Gozzini, Berkeley, CA (US)

(73) Assignee: Authentec, Inc., Melbourne, FL (US)

( * ) Notice: Subject to any disclaimer, the term of this patent is extended or adjusted under 35 U.S.C. 154(b) by 374 days.

(21) Appl. No.: 13/244,559

(22) Filed: Sep. 25, 2011

(65) Prior Publication Data

US 2013/0076486 A1    Mar. 28, 2013

(51) Int. Cl.
| | |
|---|---|
| *G05B 19/00* | (2006.01) |
| *H01L 21/00* | (2006.01) |
| *G01R 27/26* | (2006.01) |
| *G06K 9/00* | (2006.01) |
| *H01L 27/00* | (2006.01) |

(52) U.S. Cl.
CPC .................................. *G06K 9/0002* (2013.01)
USPC ......... 340/5.83; 29/25.01; 324/658; 324/686; 382/124; 250/208.1

(58) Field of Classification Search
USPC ........................................................ 340/5.83
See application file for complete search history.

(56) References Cited

U.S. PATENT DOCUMENTS

| | | | |
|---|---|---|---|
| 5,491,303 A | 2/1996 | Weiss | |
| 5,778,089 A | 7/1998 | Borza | 382/124 |
| 5,907,627 A * | 5/1999 | Borza | 382/124 |
| 5,953,441 A | 9/1999 | Setlak | 382/124 |
| 6,289,114 B1 | 9/2001 | Mainguet | 382/124 |
| 6,333,989 B1 | 12/2001 | Borza | 382/127 |
| 6,927,581 B2 | 8/2005 | Gozzini | 324/663 |
| 7,028,893 B2 | 4/2006 | Goodman et al. | 235/380 |
| 7,208,961 B2 * | 4/2007 | Miyasaka | 324/686 |
| 7,361,919 B2 | 4/2008 | Setlak | 250/556 |
| 7,417,310 B2 * | 8/2008 | Szewerenko et al. | 257/696 |
| 7,989,938 B2 | 8/2011 | Okada et al. | 257/680 |
| 2008/0069412 A1 | 3/2008 | Champagne et al. | 382/124 |
| 2008/0219521 A1 * | 9/2008 | Benkley et al. | 382/124 |
| 2008/0240523 A1 | 10/2008 | Benkley et al. | 382/126 |
| 2009/0291515 A1 | 11/2009 | Fukasawa | 438/17 |

FOREIGN PATENT DOCUMENTS

AT    413939    7/2006

OTHER PUBLICATIONS

Yannou, "3DIC & TSV Technologies: Evolution of the market drivers and development of the infrastructure", SEMICON West, Jul. 2011, pp. 1-37.

* cited by examiner

*Primary Examiner* — Kerri McNally
*Assistant Examiner* — John Mortell
(74) *Attorney, Agent, or Firm* — Allen, Dyer, Doppelt, Milbrath & Gilchrist, P.A.

(57) ABSTRACT

An electronic device may include a housing and circuitry carried by the housing. The electronic device may also include a finger sensing device carried by the housing and coupled to the circuitry. The finger sensing device may include a mounting substrate, and a semiconductor interposer having a lower surface adjacent the mounting substrate. The finger sensing device may also include a plurality of semiconductor finger sensing die on an upper surface of the semiconductor interposer in side-by-side and abutting relation, and defining a finger sensing surface to receive at least one finger thereon.

29 Claims, 6 Drawing Sheets

ELECTRONIC DEVICE INCLUDING FINGER SENSOR AND RELATED METHODS

FIELD OF THE INVENTION

The present invention relates to the field of electronics, and, more particularly, to the field of finger sensors.

BACKGROUND OF THE INVENTION

Fingerprint sensing and matching is a reliable and widely used technique for personal identification or verification. In particular, a common approach to fingerprint identification involves scanning a sample fingerprint or an image thereof and storing the image and/or unique characteristics of the fingerprint image. The characteristics of a sample fingerprint may be compared to information for reference fingerprints already in a database to determine proper identification of a person, such as for verification purposes.

A particularly advantageous approach to fingerprint sensing is disclosed in U.S. Pat. No. 5,953,441 to Setlak and assigned to the assignee of the present invention, the entire contents of which are herein incorporated by reference. The fingerprint sensor is an integrated circuit sensor that drives the user's finger with an electric field signal and senses the electric field with an array of electric field sensing pixels on the integrated circuit substrate.

U.S. Pat. No. 6,289,114 to Mainguet, which is assigned to the assignee of the present invention and is incorporated in its entirety by reference discloses a fingerprint sensor that includes a finger sensing integrated circuit (IC). The finger sensing IC includes a layer of piezoelectric or pyroelectric material placed between upper and lower electrodes to provide electric signals representative of an image of the ridges and valleys of the fingerprint.

A particularly advantageous approach to multi-biometric fingerprint sensing is disclosed in U.S. Pat. No. 7,361,919 to Setlak, which is assigned to the assignee of the present invention and is incorporated in its entirety by reference. The Setlak patent discloses a multi-biometric finger sensor sensing different biometric characteristics of a user's finger that have different matching selectivities.

A fingerprint sensor may be particularly advantageous for verification and/or authentication in an electronic device, and more particularly, a portable device, for example. Such a fingerprint sensor may be carried by the housing of a portable electronic device, for example, and may be sized to sense a fingerprint from a single-finger. For example, the AES3400 sensor from AuthenTec, Inc. of Melbourne, Fla., is widely used in a variety of notebooks, desktops and PC peripherals. Other fingerprint sensors, for example, the AES850, also from AuthenTec, Inc. of Melbourne, Fla., is a multi-function smart sensor that expands touch-based functionality of touch-screen and QWERTY smartphones with a reduced impact on sensor performance or durability.

It may be desirable in some applications to sense fingerprints from multiple fingers at a same time or from a relatively large finger sensing area. In some applications, a single large area die may be used to sense multiple fingers. As the area of the finger sensor increases, the yield from each wafer may decrease, thereby rendering the large area integrated circuit much more expensive.

U.S. Pat. No. 5,778,089 to Borza discloses a fingerprint sensing device that includes sensing pads in the form of an array of discrete contact imaging dies that are disposed next to one another in a close, but not contacting relationship. A small gap must be between adjacent dies to avoid contact between adjacent edges. Because of the gaps, fingerprint image data may be lost or may be incomplete. For particular applications, the loss of fingerprint image data may be unacceptable.

SUMMARY OF THE INVENTION

In view of the foregoing background, it is therefore an object of the present invention to provide a finger sensor with a reduced amount of fingerprint image data loss, reduced cost, and an increased finger sensing area.

This and other objects, features, and advantages in accordance with the present invention are provided by an electronic device that may include a housing and circuitry carried by housing. The electronic device may also include a finger sensing device carried by the housing and coupled to the circuitry, for example. The finger sensing device may include a mounting substrate and a semiconductor interposer having a lower surface adjacent the mounting substrate. The finger sensor may also include a plurality of semiconductor finger sensing die on an upper surface of the semiconductor interposer in side-by-side and abutting relation, and defining a finger sensing surface to receive at least one finger thereon. Accordingly, the finger sensing device advantageously has an increased structural rigidity and a reduced amount of lost fingerprint image data as compared to other increased area finger sensing devices, for example.

The semiconductor interposer and the plurality of semiconductor finger sensing die may each have a coefficient of thermal expansion (CTE) within ±20% of each other. Each semiconductor finger sensing die may include an array of pixels defining a pixel pitch, for example. Each adjacent pair of semiconductor finger sensing die may include opposing edge portions so that a spacing between pixels on opposing edge portions is not greater than 1.5 times the pixel pitch, for example. The opposing edge portions may define missing pixel positions, and a processor may be configured to generate image data for the missing pixel positions based upon adjacent pixels, for example.

The semiconductor interposer and the plurality of semiconductor finger sensing die may each include a same semiconductor material, for example. The plurality of semiconductor finger sensing die may be arranged in a plurality of rows and a plurality of columns. At least one of the plurality of rows and plurality of columns may not be greater than two, for example.

Each of the plurality semiconductor finger sensing die may include a plurality of bond pads along at least one side thereof on a periphery of the plurality of semiconductor finger sensing die. The mounting substrate may include one of a ball grid array substrate and a land grid array substrate coupled to the plurality of bond pads, for example. The electronic device may further include a connector carried by the mounting substrate and coupled to the plurality of bond pads.

The circuitry may include a processor and a wireless transceiver coupled thereto. The electronic device may further include a protection layer over the plurality of semiconductor finger sensing die, for example.

A method aspect is directed to a method of a method of making finger sensing device. The method may include positioning a semiconductor interposer having a lower surface adjacent a mounting substrate, for example. The method may further include positioning a plurality of semiconductor finger sensing die on an upper surface of the semiconductor interposer in side-by-side and abutting relation to define a finger sensing surface to receive at least one finger thereon.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime and multiple prime notation are used to indicate similar elements in different embodiments.

Figure 1:
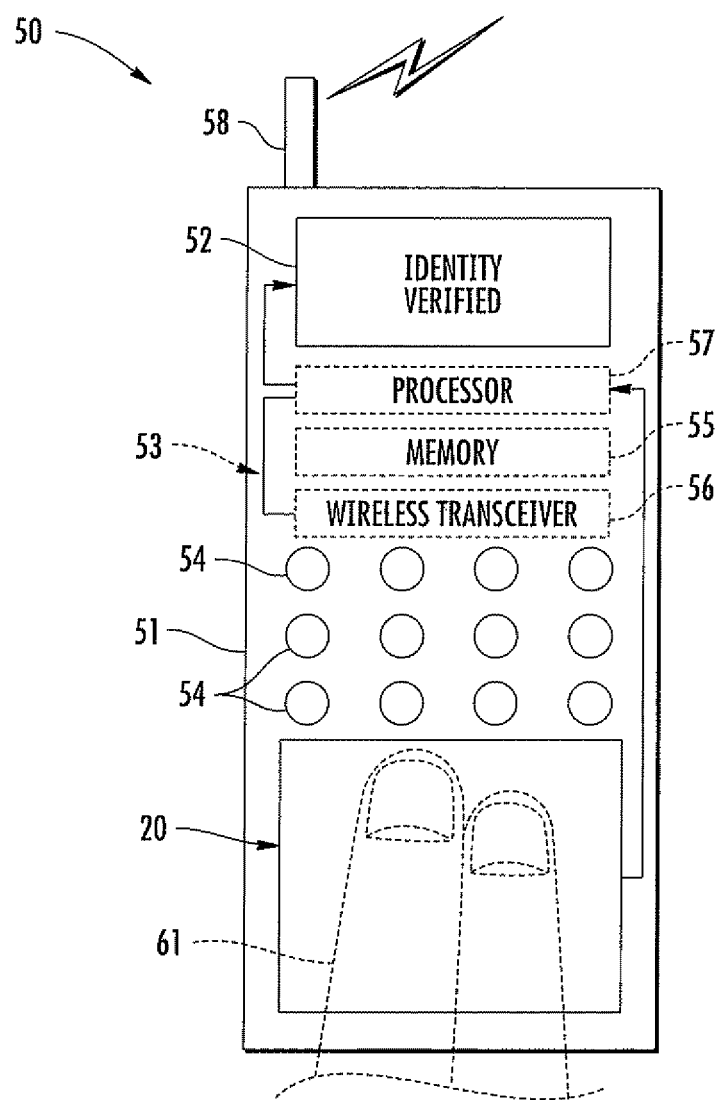
FIG. 1 is a schematic plan view of an electronic device including a finger sensing device in accordance with the present invention.

Referring initially to FIG. 1, an embodiment of a finger sensing device 20 in accordance with the present invention is now described. The finger sensing device 20 is illustratively mounted on an exposed surface of an electronic device 50. Of course, the finger sensor sensing device 20 can also be used with other portable or stationary electronic devices.

The electronic device 50 includes a housing 51, a display 52 carried by the housing, and circuitry 53 also carried by the housing and connected to the display and to the finger sensing device 20. An array of input keys 54 are also provided and, where, for example, the electronic device 50 is in the form of a cellphone, may be used for dialing and other applications as will be appreciated by those skilled in the art.

The circuitry 53 may include a processor 57 and memory 55 coupled thereto, for example. The circuitry 53 may also include a wireless transceiver 56 configured to perform wireless communications functions, for example, voice and/or data communications. An antenna 58 is illustratively carried by the housing 51 and is coupled to the wireless transceiver 56.

Of course, the finger sensing device 20 may also include circuitry embedded therein and/or in cooperation with the circuitry 53 to provide menu navigation and selection functions, tactile feedback, and/or power up functions as will be appreciated by those skilled in the art.

Figure 2:
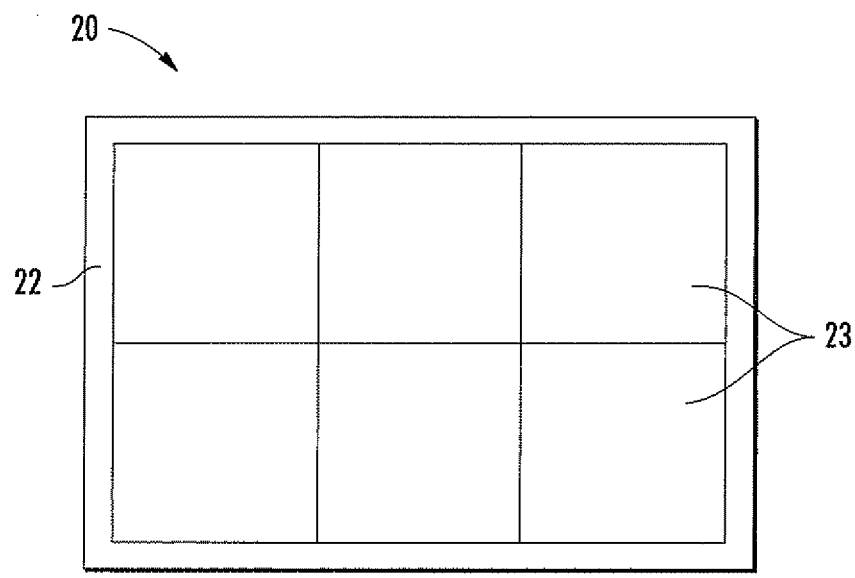
FIG. 2 is a top plan view of the finger sensing device of FIG. 1.
Figure 3:
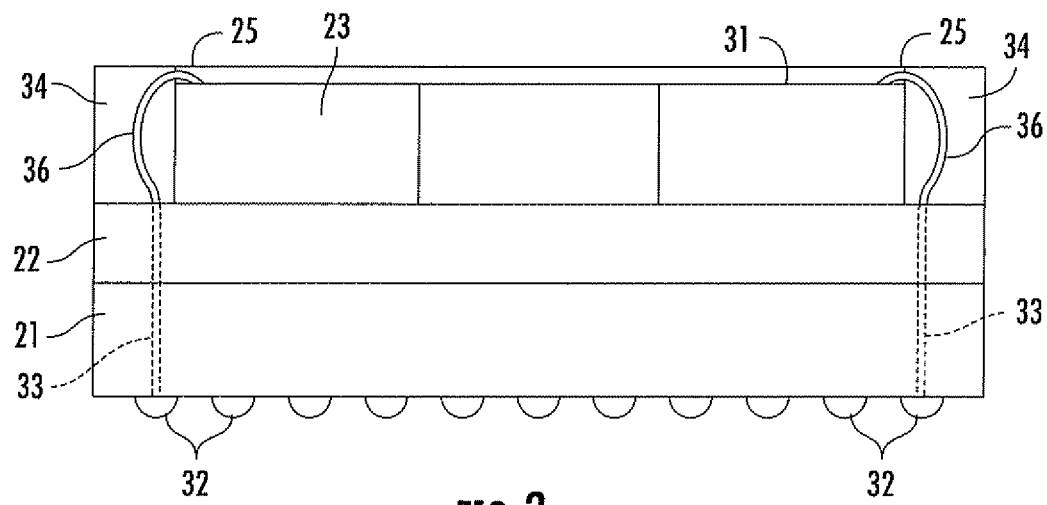
FIG. 3 is a cross-sectional view of the finger sensing device of FIG. 2.

Referring additionally to FIGS. 2-3, the finger sensing device 20 includes a mounting substrate 21. The mounting substrate may be ceramic, for example. The mounting substrate 21 may be another material as will be appreciated by those skilled in the art.

The finger sensing device 20 also includes a semiconductor interposer 22 having a lower surface adjacent said mounting substrate 21. The semiconductor interposer 22 may be silicon, for example, or another semiconductor material, as will be appreciated by those skilled in the art. The semiconductor interposer 21 may be 600 microns thick, for example. The semiconductor interposer 22 may be coupled to the mounting substrate 21 with an adhesive material, for example, an epoxy.

The finger sensing device 20 also includes semiconductor finger sensing die 23 on an upper surface of the semiconductor interposer 22. The semiconductor interposer 22 and semiconductor finger sensing die 23 may each include a same semiconductor material. For example, the semiconductor interposer 22 and the semiconductor finger sensing die 23 may each be silicon. Of course, the semiconductor interposer 22 and the semiconductor finger sensing die 23 may be another semiconductor material. As will we appreciated by those skilled in the art, in some embodiments, the semiconductor interposer 22 and the semiconductor finger sensing die 23 may include different materials, but may have respective coefficients of thermal expansion (CTEs) that are within a range, for example, ±20% of each other, and more preferably ±10% of each other. Of course, in some embodiments, the semiconductor interposer 22 and the semiconductor finger sensing die 23 may have a same CTE, for example, when the semiconductor interposer and the semiconductor finger sensing die are each silicon. As will be appreciated by those skilled in the art, as the number of finger sensing die 23 carried by the semiconductor interposer 22 increase, it may be desirable to have respective CTEs within a more narrow range, for example. Additionally, matching of CTEs, for example, may increase the structural rigidity of the finger sensing device 20. The semiconductor interposer 22 and the semiconductor finger sensing die 23 may each have a CTE within a different range of each other, such as, for example ±40%, or another range.

The semiconductor finger sensing die 23 are arranged in side-by-side and abutting relation, and more particularly, are arranged in rows and columns. The side-by-side and abutting relation of the semiconductor finger sensing die 23 advantageously define a finger sensing surface sufficient in area to receive multiple fingers 61 thereon, for example.

Illustratively, the semiconductor finger sensing die 23 are configured in two rows and three columns for a total of six semiconductor finger sensing die (FIG. 2). In this configuration, each semiconductor finger sensing die 23 is an exterior semiconductor finger sensing die, that is, each has an edge on the periphery of the sensing surface. The six semiconductor finger sensing die 23 may define a finger sensing surface to receive two fingers 61, for example. Of course, in other embodiments, the semiconductor finger sensing die 23 may be arranged in other configurations, as will be described in further detail below. An exemplary semiconductor finger sensing die 23 may be about 0.5 inches wide by 0.8 inches long.

Figure 4:
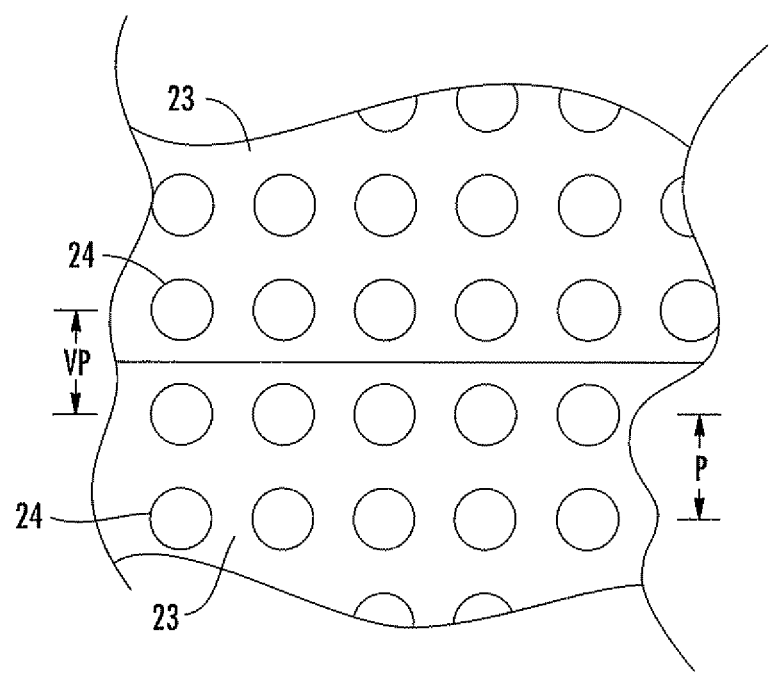
FIG. 4 is an enlarged plan view of abutting edges of edge-abutting finger-sensing die of the multi-finger sensing device of FIG. 2.

Referring now additionally to FIG. 4, each semiconductor finger sensing die 23 includes an array of pixels 24 defining a pixel pitch. The pixels 24 may be electric-field sensing pixels, for example, as described in U.S. Pat. No. 5,953,441 to Setlak. Alternatively, or additionally, the pixels 24 may be capacitive sensing pixels, as described in U.S. Pat. No. 6,927,581 to Gozzini, for example, and assigned to the assignee of the present invention and the entire contents of which are herein incorporated by reference.

An exemplary pitch P between adjacent pixels may be 50.8 microns, for example. Each adjacent pair of semiconductor finger sensing die 23 has opposing edge portions so that spacing between pixels on opposing edge portions VP is not greater than 1.5 times the pixel pitch P. In other words, the spacing between pixels on opposing edge portions VP may be less than or equal to about 76.2 microns. In some embodiments, it may be more preferable that each adjacent pair of semiconductor finger sensing die 23 has opposing edge portions so that spacing between pixels on opposing edge portions VP is not greater than the pixel pitch P, i.e., about 50.8 microns. This advantageously reduces any lost image data to a single pixel row or column, for example. Each semiconductor sensing die 23 is configured to sense adjacent portions of the multiple fingers.

The opposing edge portions define missing pixel positions, and in particular, a row or column of missing pixel portions. In other words, the edges where adjacent semiconductor finger sensing die 23 abut would typically include a row or column of pixels if the adjacent die were a single die, for example. The processor 57 is configured to generate image data for the missing pixel positions based upon adjacent pixels. The processor 57 may generate the image data for the missing pixel positions by interpolating the image data from adjacent pixels, for example. In other words, the processor 57 may use adjacent pixels to sense dead space, which, for example, may be particularly advantageous with a relatively thick protection layer or coating. Alternatively, or additionally, the processor 57 may also generate the image data from the missing pixel positions by using weighting functions, as will be appreciated by those skilled in the art. Advantageously, the image data may not be completely lost, which may increase accuracy, for example to an acceptable threshold for a particular application.

The processor 57 may also be configured to cooperate with the semiconductor finger sensing die 23 and the memory 55 to perform an authentication function, for example. The processor 57 may also cooperate with the semiconductor finger sensing die 23 to perform a spoof detection function. Other and/or additional functions may be performed by the processor 57, as will be appreciated by those skilled in the art.

Each of the semiconductor finger sensing die 23 also includes bond pads 25 along a side of the outer periphery of the semiconductor finger sensing die (FIG. 2). Of course, in other embodiments, the bond pads 25 may be along one or any number of peripheral sides of the semiconductor finger sensing die 23. As noted above, each semiconductor finger sensing die 23 is an exterior finger sensing die. As will be appreciated by those skilled in the art, this configuration advantageously allows each semiconductor finger sensing die 23 to have bond pads 25 along a peripheral side thereof, as will be appreciated by those skilled in the art.

The mounting substrate 21 further includes a mounting feature in the form of a ball 32 grid array coupled to the bond pads 25 (FIG. 3). In other embodiments, the mounting feature may be in the form of a land grid array coupled to the bond pads 25. Of course, the mounting substrate 21 may include additional or other types of mounting arrangements or features, as will be appreciated by those skilled in the art.

The semiconductor interposer 22 and mounting substrate 21 illustratively include conductive vias 33 for coupling the bond pads 25 to the mounting substrate. In particular, the vias 33 couple the bond pads 25 to the mounting feature, i.e., the ball grid array via bond wires 36.

A protection layer 31 is illustratively over the semiconductor finger sensing die 23 (FIG. 3). The protection layer 31 may be an epoxy, for example. The protection layer 31 may be polyimide, glass, or other protective material, for example. As will be appreciated by those skilled in the art, the protection layer 31 advantageously provides increased protection to the finger sensing die 23 from damage, such as for example, from scratching. The protection layer may provide increased structural rigidity.

A frame 34 or bezel may surround the semiconductor finger sensing die 23 (FIG. 3). The frame 34 may provide additional structural rigidity. Of course, in some embodiments, the mounting substrate 21 may extend upwardly to surround the semiconductor finger sensing die 23. Additionally, a drive ring may be used, as will be appreciated by those skilled in the art. In other embodiments, the frame 34 may provide the drive ring.

As will be appreciated by those skilled in the art, a single large area finger sensing die with a plurality of pixels, for example, to sense multiple fingers, may be particularly susceptible to defects. More particularly, as the size of the finger sensing die increases, a defect in a single pixel, for example, may cause the entire finger sensing die to fail. The present embodiments advantageously use smaller die fabrication techniques with an understood yield curve. Additionally, the placement of the finger sensing die 23 and the cooperation of the processor 57 may advantageously allow compliance with image quality specifications, for example, as defined by PTV, Appendix F, and FIPS 201 standards, as will be appreciated by those skilled in the art.

Figure 5:
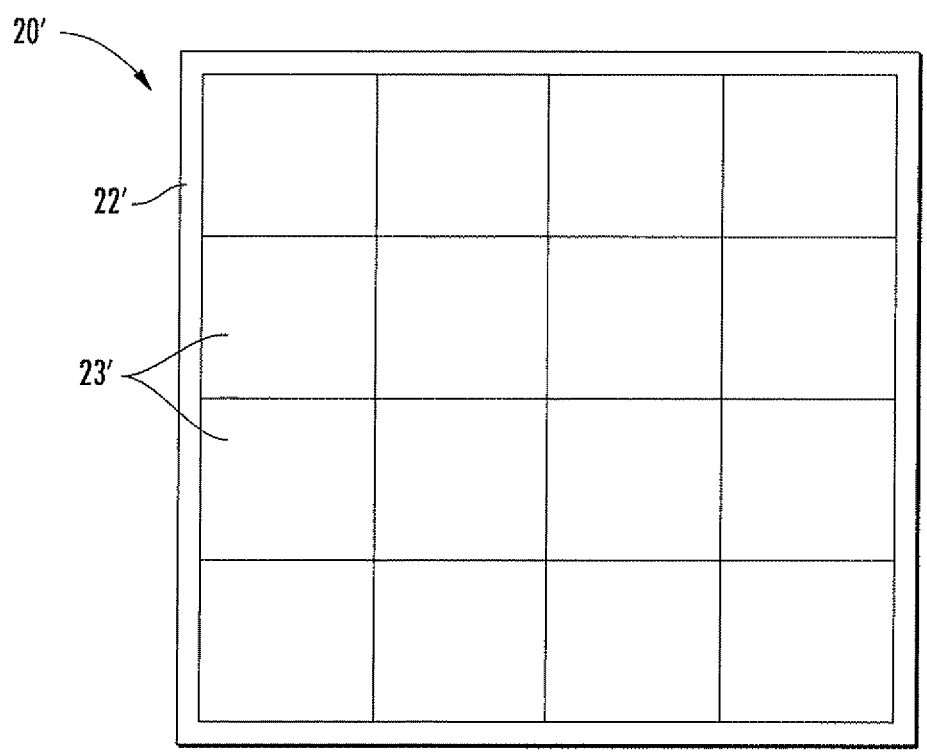
FIG. 5 is a top plan view of another multi-finger sensing device in accordance with another embodiment of the present invention.

Referring now to FIG. 5, in another embodiment, the semiconductor finger sensing die 23' are configured in four rows and four columns for a total of sixteen semiconductor finger sensing die and are mounted on an upper surface of a silicon interposer 22' similarly to the embodiments described above with respect to FIGS. 1-4. The sixteen semiconductor finger sensing die 23' may define a finger sensing surface to receive four or more fingers, for example. The sixteen semiconductor finger sensing die 23' may total about 3 inches high and 3.2 inches wide. As will be appreciated by those skilled in the art, the middle die are not accessible at an edge thereof, for example, for bond pads, and thus cannot be used. Other die assembly techniques are used for these die, for example, through silicon vias (TSVs), as will be appreciated by those skilled in the art.

Figure 6:
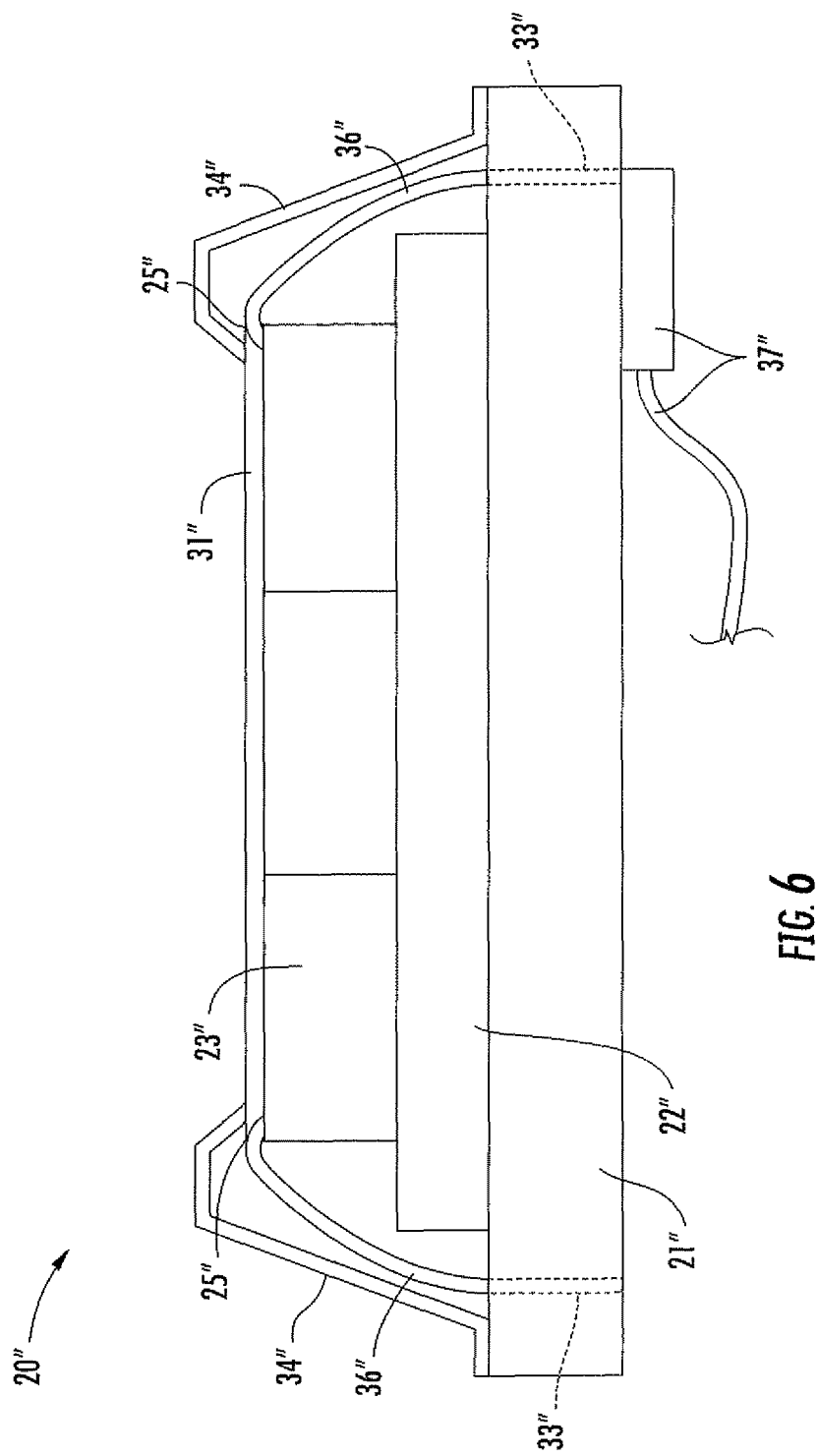
FIG. 6 is a cross-sectional view of a finger sensing device in accordance with another embodiment of the present invention.

Referring now to FIG. 6, in another embodiment, the semiconductor interposer 22" may be smaller than the mounting substrate 21". This advantageously allows the frame 34" to couple to an upper surface of the mounting substrate 21" adjacent the lower surface of the semiconductor interposer 22". The frame 34" may be coupled to the mounting substrate 21" by an adhesive layer, for example, epoxy.

The mounting substrate 21" illustratively carries a connector 37" and its flexible cable, for example, such as for a universal serial bus (USB) connection.

Figure 7:
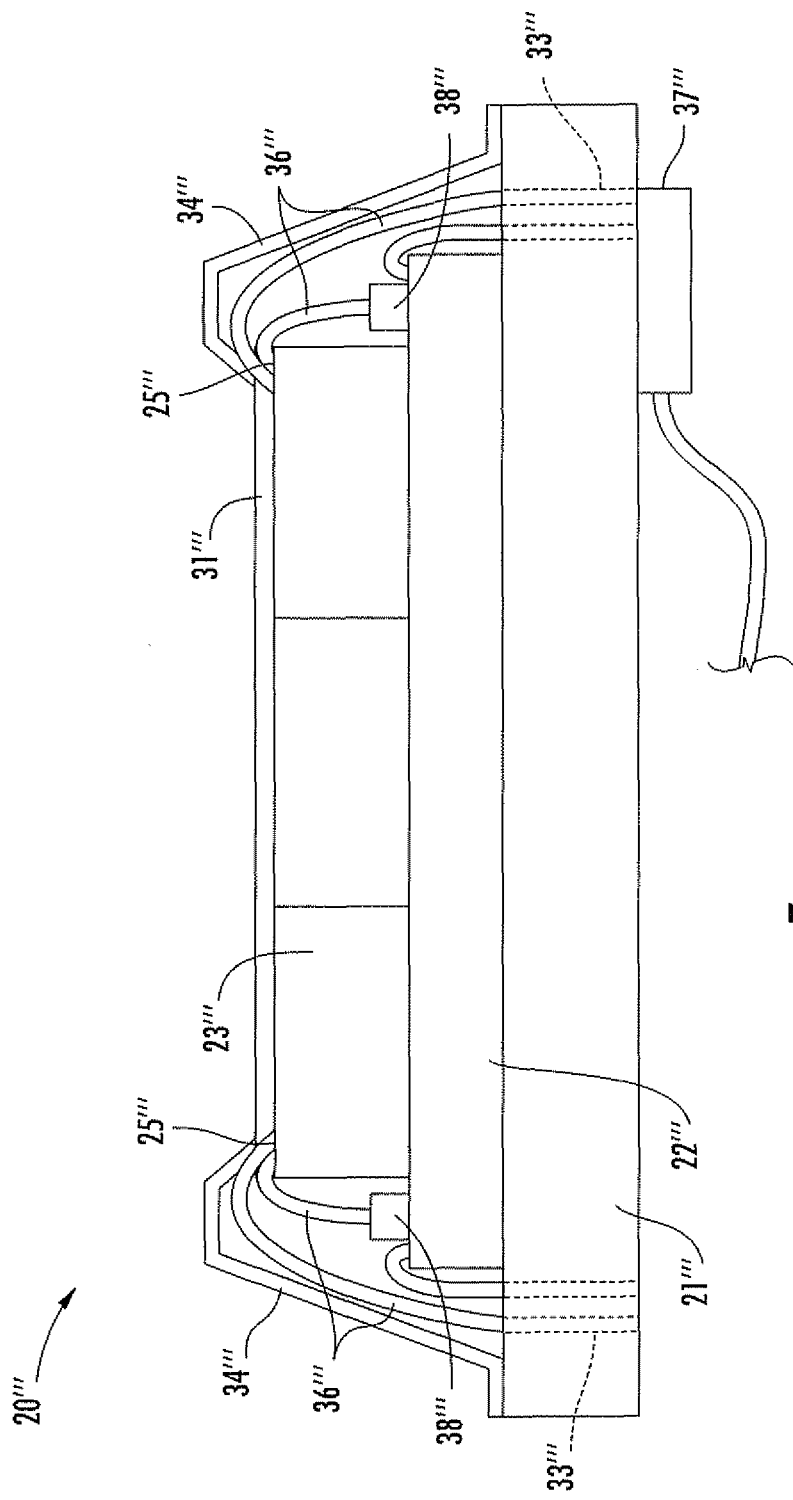
FIG. 7 is a cross-sectional view of a finger sensing device in accordance with another embodiment of the present invention.

Referring now to FIG. 7, the semiconductor interposer 22'" may include circuitry 38'" carried by an upper surface thereof. The circuitry 38'" may be active circuitry, for example, for processing image or pixel data. The circuitry 38'" may include other circuitry and, in some embodiments, may cooperate with the processor to perform any of the above-noted functions. The circuitry 38'" may advantageously enhance the functionality of the finger sensing device 20'", as will be appreciated by those skilled in the art.

Figure 8:
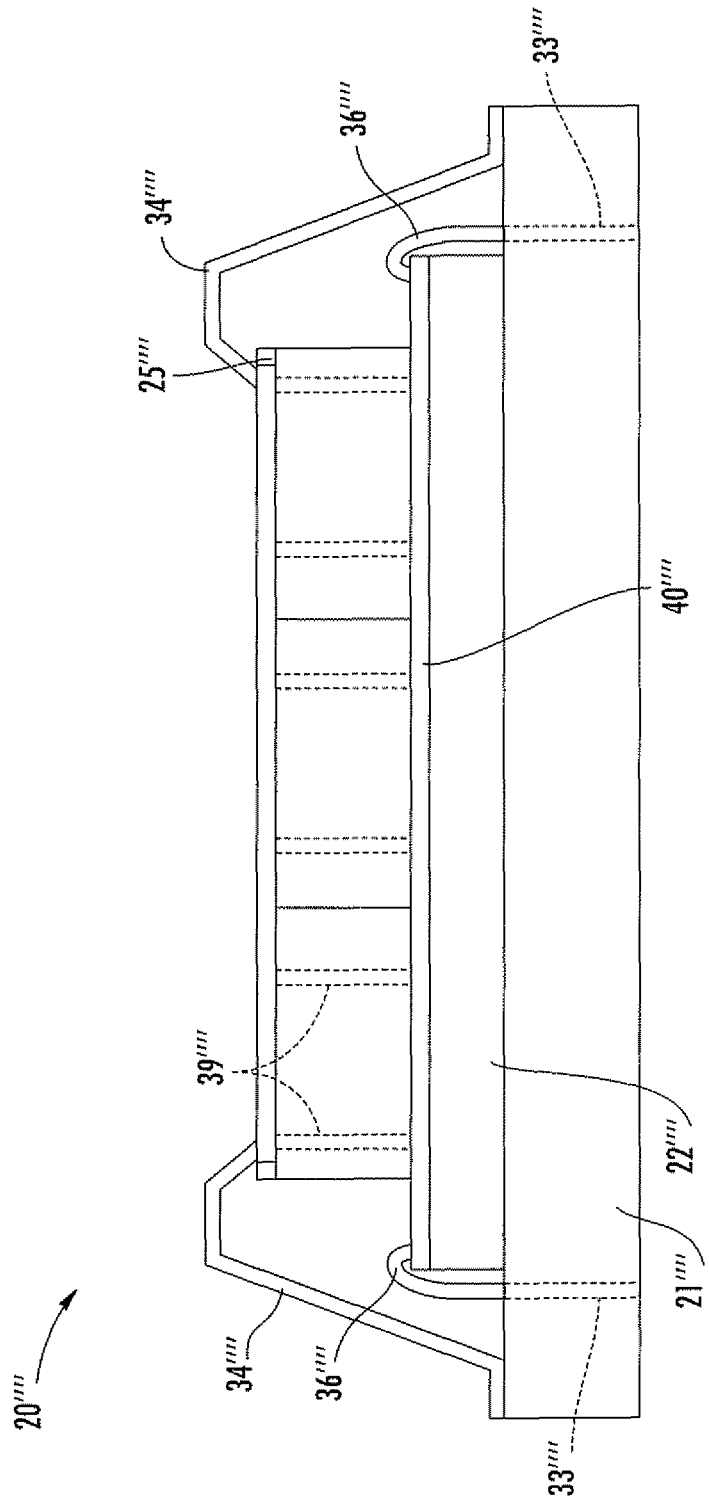
FIG. 8 is a cross-sectional view of a finger sensing device in accordance with another embodiment of the present invention.

Referring now to FIG. 8, another embodiment where middle die are not accessible for bond pads, (i.e, there are more than two rows and/or two columns), is described. Where the middle die are not accessible, TSVs 39"" may be configured to route connections of the middle die to a conductive trace 40"" on the top of the semiconductor interposer 22"".

Another aspect is directed to a method of making a finger sensing device 20 that includes positioning a semiconductor interposer 22 having a lower surface adjacent a mounting substrate 21. The method also includes positioning semiconductor finger sensing die 23 on an upper surface of the semiconductor interposer 22 in side-by-side and abutting relation to define a finger sensing surface to at least one finger thereon.

As will be appreciated by those skilled in the art, a dicing saw or a laser may be used to singulate silicon die from a wafer with a placement tolerance of about 5 microns. Thus, the edges of the finger sensing die 23 may be defined with increased precision. The wafer from which the finger sensing die 23 are cut is about 700 microns thick, which allows sufficient material to achieve a repeatable die butting placement, as described above.

While several semiconductor finger sensing die arrangements have been described herein, which may be particularly advantageous for sensing multiple fingers, it will be appreciated by those skilled in the art that the finger sensing device may include only two semiconductor finger sensing die for sensing a single finger. These single finger embodiments may benefit from a lower cost due to better wafer yield. Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic device comprising:
    a housing;
    circuitry carried by said housing; and
    a finger sensing device carried by said housing and coupled to said circuitry, said finger sensing device comprising
        a mounting substrate,
        a semiconductor interposer having a lower surface adjacent said mounting substrate, and
        a plurality of semiconductor finger sensing die on an upper surface of said semiconductor interposer in side-by-side and abutting relation, and defining a finger sensing surface to receive at least one finger thereon.

2. The electronic device of claim 1, wherein said semiconductor interposer and said plurality of semiconductor finger sensing die each have a coefficient of thermal expansion (CTE) within ±20% of each other.

3. The electronic device of claim 1, wherein each semiconductor finger sensing die includes an array of pixels defining a pixel pitch; and wherein each adjacent pair of semiconductor finger sensing die comprises opposing edge portions so that a spacing between pixels on opposing edge portions is not greater than 1.5 times the pixel pitch.

4. The electronic device of claim 3, wherein said opposing edge portions define missing pixel positions; and further comprising a processor configured to generate image data for the missing pixel positions based upon adjacent pixels.

5. The electronic device of claim 1, wherein said semiconductor interposer and said plurality of semiconductor finger sensing die each comprises a same semiconductor material.

6. The electronic device of claim 1, wherein said plurality of semiconductor finger sensing die are arranged in a plurality of rows and a plurality of columns.

7. The electronic device of claim 6, wherein at least one of the plurality of rows and plurality of columns is not greater than two.

8. The electronic device of claim 1, wherein each of said plurality semiconductor finger sensing die comprises a plurality of bond pads along at least one side thereof on a periphery of said plurality of semiconductor finger sensing die.

9. The electronic device of claim 8, wherein said mounting substrate comprises one of a ball grid array substrate and a land grid array substrate coupled to said plurality of bond pads.

10. The electronic device of claim 8, further comprising a connector carried by said mounting substrate and coupled to said plurality of bond pads.

11. The electronic device of claim 1, wherein said circuitry comprises a processor and a wireless transceiver coupled thereto.

12. The electronic device of claim 1, further comprising a protection layer over said plurality of semiconductor finger sensing die.

13. A finger sensing device comprising:
    a mounting substrate;
    a semiconductor interposer having a lower surface adjacent said mounting substrate; and
    a plurality of semiconductor finger sensing die on an upper surface of said semiconductor interposer in side-by-side and abutting relation, and defining a finger sensing surface to receive at least one finger thereon.

14. The finger sensing device of claim 13, wherein said semiconductor interposer and said plurality of semiconductor finger sensing die each have a coefficient of thermal expansion (CTE) within ±20% of each other.

15. The finger sensing device of claim 13, wherein each semiconductor finger sensing die includes an array of pixels defining a pixel pitch; and wherein each adjacent pair of semiconductor finger sensing die comprises opposing edge portions so that a spacing between pixels on opposing edge portions is not greater than 1.5 times the pixel pitch.

16. The finger sensing device of claim 13, wherein said semiconductor interposer and said plurality of semiconductor finger sensing die each comprises a same semiconductor material.

17. The finger sensing device of claim 13, wherein said plurality of semiconductor finger sensing die are arranged in a plurality of rows and a plurality of columns.

18. The finger sensing device of claim 17, wherein at least one of the plurality of rows and plurality of columns is not greater than two.

19. The finger sensing device of claim 13, wherein each of said plurality semiconductor finger sensing die comprises a plurality of bond pads along at least one side thereof on a periphery of said plurality of semiconductor finger sensing die.

20. The finger sensing device of claim 19, wherein said mounting substrate comprises one of a ball grid array substrate and a land grid array substrate coupled to said plurality of bond pads.

21. The finger sensing device of claim 19, further comprising a connector carried by said mounting substrate and coupled to said plurality of bond pads.

22. The finger sensing device of claim 13, further comprising a protection layer over said plurality of semiconductor finger sensing die.

23. A method of making a finger sensing device comprising:
    positioning a semiconductor interposer having a lower surface adjacent a mounting substrate; and
    positioning a plurality of semiconductor finger sensing die on an upper surface of the semiconductor interposer in side-by-side and abutting relation to define a finger sensing surface to at least one finger thereon.

24. The method of claim 23, wherein the semiconductor interposer and the plurality of semiconductor finger sensing die each have a coefficient of thermal expansion (CTE) within ±20% of each other.

25. The method of claim 23, wherein each semiconductor finger sensing die includes an array of pixels defining a pixel pitch; and wherein each adjacent pair of semiconductor finger sensing die comprises opposing edge portions so that a spacing between pixels on opposing edge portions is not greater than 1.5 times the pixel pitch.

26. The method of claim 23, wherein the semiconductor interposer and the plurality of semiconductor finger sensing die each comprises a same semiconductor material.

27. The method of claim 23, wherein the plurality of semiconductor finger sensing die are arranged in a plurality of rows and a plurality of columns.

28. The method of claim 27, wherein at least one of the plurality of rows and plurality of columns is not greater than two.

29. The method of claim 23, further comprising a forming a protection layer over the plurality of semiconductor finger sensing die.

* * * * *

UNITED STATES PATENT AND TRADEMARK OFFICE
CERTIFICATE OF CORRECTION

PATENT NO.        : 8,836,478 B2
APPLICATION NO.   : 13/244559
DATED             : September 16, 2014
INVENTOR(S)       : Bond et al.

It is certified that error appears in the above-identified patent and that said Letters Patent is hereby corrected as shown below:

In the Claims

Column 8, Line 2     Delete: "plurality semiconductor"
                     Insert: --plurality of semiconductor--

Column 8, Line 48    Delete: "plurality semiconductor"
                     Insert: --plurality of semiconductor--

Column 9, Line 22    Delete: "comprising a forming"
                     Insert: --comprising forming--

Signed and Sealed this
Twenty-fifth Day of November, 2014

Michelle K. Lee
*Deputy Director of the United States Patent and Trademark Office*